(12) United States Patent
Fredeman et al.

(10) Patent No.: US 6,504,392 B2
(45) Date of Patent: Jan. 7, 2003

(54) ACTIVELY CONTROLLED HEAT SINK FOR CONVECTIVE BURN-IN OVEN

(75) Inventors: John A. Fredeman, Wappingers Falls, NY (US); David L. Gardell, Fairfax, VT (US); Marc D. Knox, Hinesburg, VT (US); Mark R. LaForce, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/277,233

(22) Filed: Mar. 26, 1999

(65) Prior Publication Data

US 2002/0075024 A1 Jun. 20, 2002

(51) Int. Cl.⁷ .............................................. G01R 31/02
(52) U.S. Cl. ....................................... 324/760; 324/765
(58) Field of Search ................................ 324/765, 760; 219/209, 483; 438/14, 18; 165/80.3, 80.6; 361/697, 718

(56) References Cited

U.S. PATENT DOCUMENTS

| | | |
|---|---|---|
| 3,710,251 A | 1/1973 | Hagge et al. |
| 4,571,608 A | 2/1986 | Johnson |
| 4,787,752 A | 11/1988 | Fraser et al. |
| 4,791,364 A | 12/1988 | Kufis et al. |
| 4,870,355 A | 9/1989 | Kufis et al. |
| 5,006,796 A | 4/1991 | Burton et al. |
| 5,052,821 A | 10/1991 | Gisdakis et al. |
| 5,123,850 A | 6/1992 | Elder et al. |
| 5,126,656 A | 6/1992 | Jones |
| 5,126,919 A | 6/1992 | Yamamoto et al. |
| 5,164,661 A | 11/1992 | Jones |
| 5,254,839 A | 10/1993 | Laine |
| 5,414,370 A | 5/1995 | Hashinaga et al. |
| 5,420,521 A | 5/1995 | Jones |
| 5,452,181 A | 9/1995 | Hoover |
| 5,484,262 A | 1/1996 | Thomas et al. |
| 5,579,826 A | 12/1996 | Hamilton et al. |
| 5,592,363 A | 1/1997 | Atarashi et al. |
| 5,594,624 A | 1/1997 | Clemens et al. |
| 5,597,501 A | 1/1997 | Pollock |
| 5,624,750 A | 4/1997 | Martinez et al. |
| 5,637,921 A | 6/1997 | Burward-Hoy |
| 5,676,199 A | 10/1997 | Lee |
| 5,712,448 A | 1/1998 | Vandersande et al. |
| 5,911,897 A * | 6/1999 | Hamilton .................... 219/209 |

* cited by examiner

*Primary Examiner*—Vinh P. Nguyen
(74) *Attorney, Agent, or Firm*—Anthony J. Canale; Robert A. Walsh; James M. Leas

(57) ABSTRACT

A socket for testing or burning-in electronic components has a cover including a heat sink and a sensor. The heat sink and sensor are spring loaded so they make direct, temporary contact to an electronic component in the socket during burn-in. A heat transferring device is coupled to each heat sink. The heat transferring device uses input from the sensor to provide heat or cooling to each heat sink to individually control the temperature of each component. The heat transferring device can be an electric heater or a cooling device, such as a fan. Both can also be used. A plurality of these sockets are used in a forced air convective oven for burning-in a plurality of electronic components at one time. The oven provides oven heating and cooling for all components while the socket heater and sensor provide individual temperature control for each component.

43 Claims, 15 Drawing Sheets

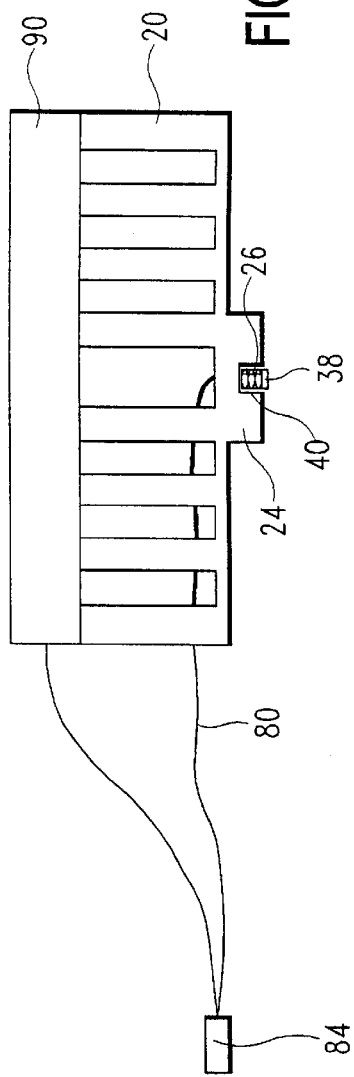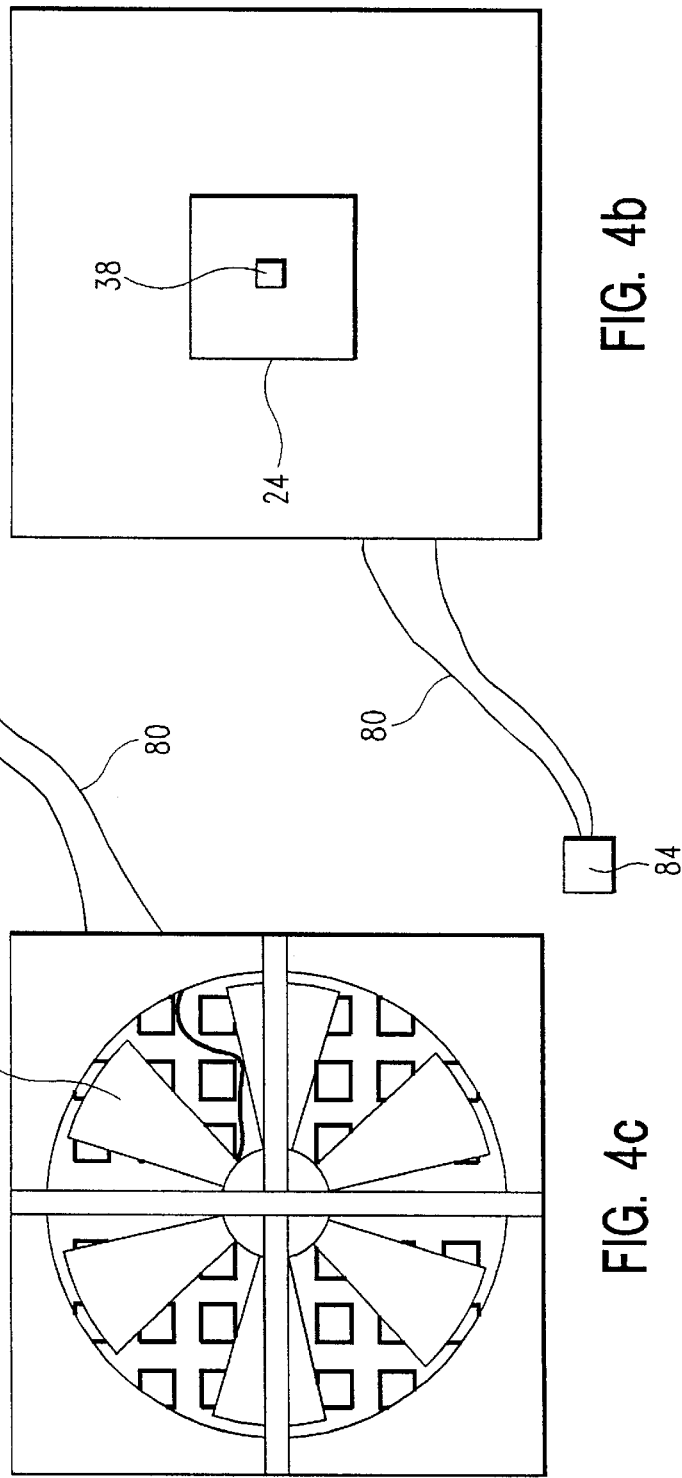

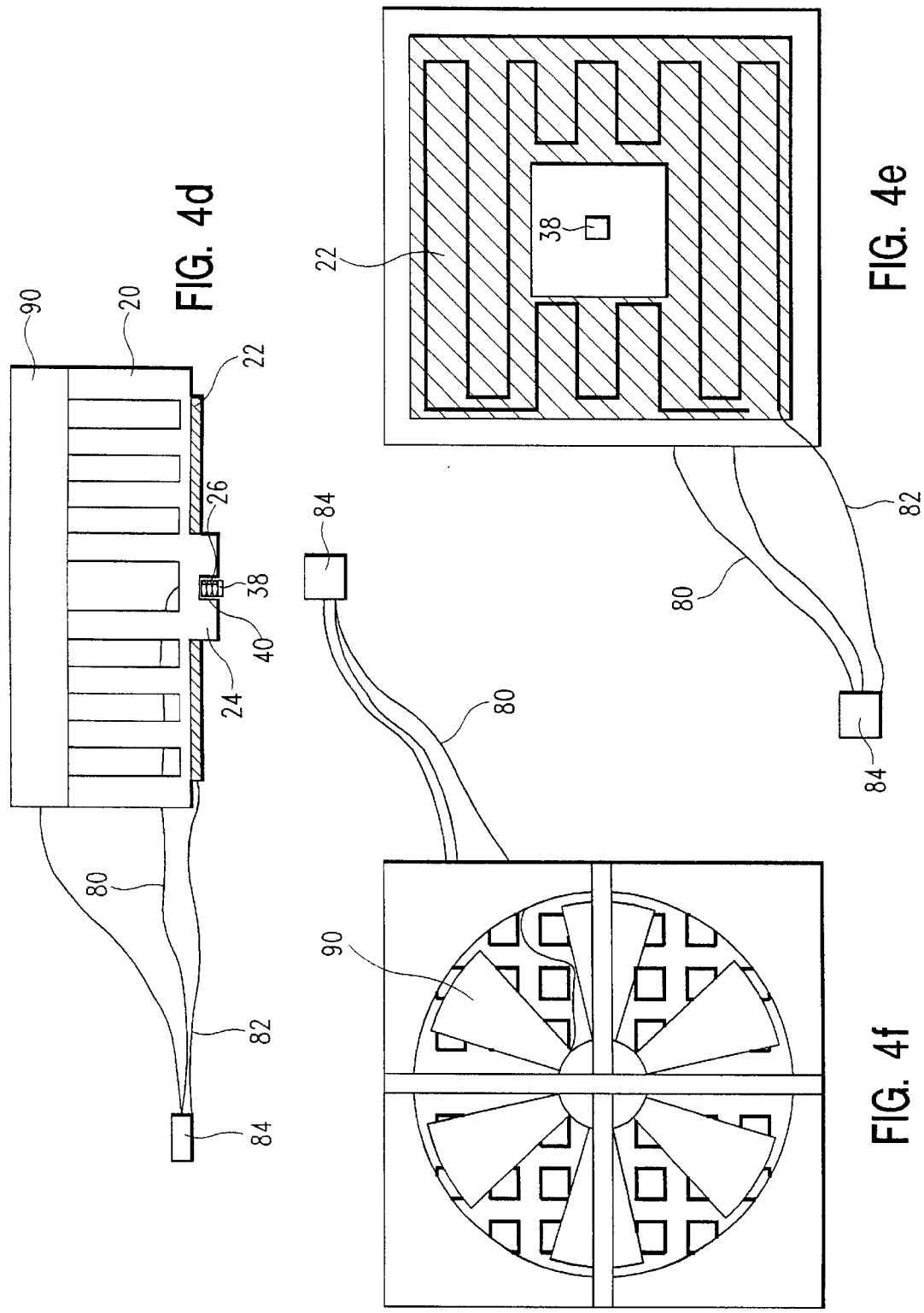

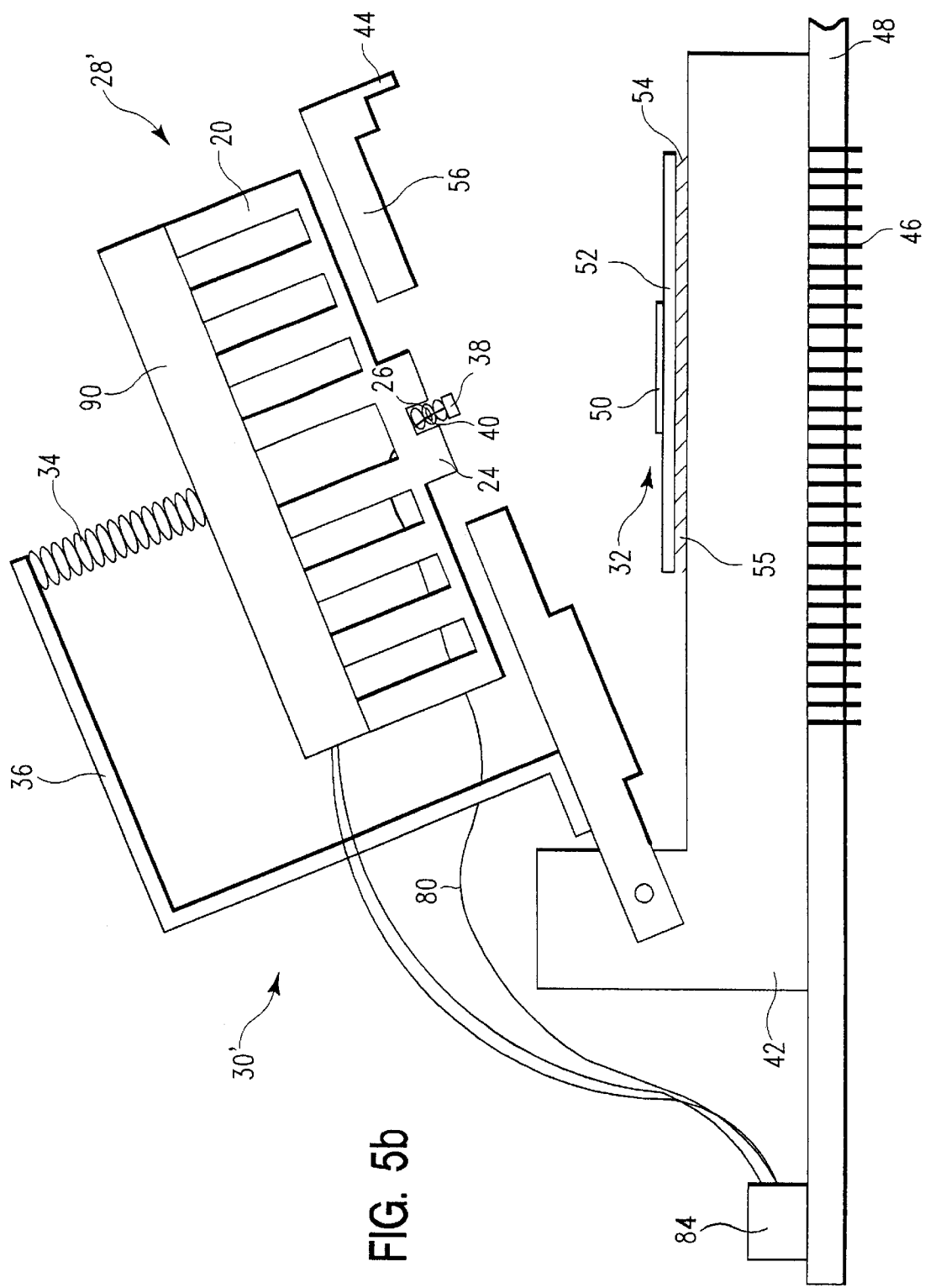

ACTIVELY CONTROLLED HEAT SINK FOR CONVECTIVE BURN-IN OVEN

FIELD OF THE INVENTION

This invention generally relates to testing and burning in semiconductor components. More particularly, it relates to apparatus for controlling the temperature of high power electronic components during test or burn-in. Even more particularly, it relates to apparatus that can burn-in components dissipating substantially different amounts of power while providing each component at the same temperature.

BACKGROUND OF THE INVENTION

Electronic components are operated at high temperature and voltage conditions during burn-in to weed out defective components and to establish increased reliability for those that pass. To provide the high temperature, components have been mounted in sockets on boards and the boards loaded with components mounted in forced air convection ovens. The ovens themselves are designed to provide a reasonably uniform temperature profile in all portions of the oven. When burning in relatively low power parts the oven temperature is set to approximately equal the desired burn in temperature. Higher power parts are usually burned in by decreasing the oven temperature so that self heating of the components brings them back up to the desired burn in temperature. The amount of self heating that a component experiences during burn in can be calculated by multiplying the part power (watts) by the device to air thermal resistance of the socket (degrees C per watt).

However, when high power dissipating components are operated in a low temperature oven, the variation in dissipation among the components causes substantial variation in the temperature actually experienced by the different components in the oven. Thus, the different components experience different burn-in stress temperatures depending on the heat each component and its neighbors dissipate. Also, parts have been found to vary in temperature as a result of unavoidable variation in airflow velocity and temperature in the oven.

Various systems attempting to burn-in high power components at a more uniform temperature have been disclosed. Tower systems, in which components are individually heated while nearby supporting electronics operates at low temperature, have suffered from high thermal resistance and low throughput. Liquid cooled systems have advantageously low thermal resistance, and can therefore dissipate large amounts of heat. They also have nearby control electronics that operates at low temperature. However, liquid cooled systems suffer greatly from very high cost and low throughput as compared to standard forced air convection oven systems. Thus, a better solution is needed that provides a system in which the temperature of each module can be precisely controlled without adding substantially to cost and without reducing throughput, and this solution is provided by the following invention.

SUMMARY OF THE INVENTION

It is therefore an object of the present invention to provide apparatus for burning-in large numbers of high power modules while precisely measuring and controlling the temperature of each module.

It is a further object of the present invention that the apparatus can be adapted to conventional forced air convection ovens so as to extend the usefulness of conventional ovens to high power components.

It is a further object of the present invention that the heat sink assembly can be used to control the temperature of an individual component during module test or during burn-in.

It is a feature of the present invention that apparatus includes a heat sink for temporary contact with the electronic component during burn-in, a sensor in direct contact with the electronic component and isolated from the heat sink, and a heat transferring device having input from the sensor for providing or removing heat to obtain a predetermined temperature for the component.

It is a feature of the present invention that the component to air thermal resistance through the heat sink is exceptionally low, allowing for burn in of high power parts at relatively high air temperature.

It is a feature of one embodiment of the present invention that the heat transferring device is an electrical resistance heater in direct contact with the heat sink.

It is a feature of another embodiment of the present invention that the heat transferring device comprises a cooling device.

It is a feature of this embodiment of the present invention that the cooling device for each heat sink is a fan directing air flow on that heat sink.

It is an advantage of the present invention components operate at the same temperature independent of variation in dissipation, airflow velocity and airflow temperature.

These and other objects, features, and advantages of the invention are accomplished by providing an apparatus for burning-in a plurality of electronic components dissipating high power. The apparatus comprises a chamber having a chamber temperature controller and a plurality of assemblies for burning-in components in the chamber. Each assembly comprises a socket for temporarily holding one of the components during burn-in; a heat sink for pressing in temporary direct contact with the component in the socket; a temperature sensor for sensing temperature of the component in the socket; and a heat transferring device positioned to transfer heat to or from the heat sink.

The temperature controller is a heating device, such as an electric heater or a cooling device, such as a fan. It can also be a thermoelectric device or an air or liquid impingement device. The ambient temperature in the oven is established so that the individual temperature controllers for each component can bring all components to the same specified temperature.

BRIEF DESCRIPTION OF THE DRAWINGS

The foregoing and other objects, features, and advantages of the invention will be apparent from the following detailed description of the invention, as illustrated in the accompanying drawings, in which:

FIG. 4a is a cross sectional view of a heat sink having a fan and a pedestal, the pedestal having a recess;

FIG. 4b is a bottom view of the heat sink of FIG. 4a further illustrating the pedestal and recess;

FIG. 4c is a top view of the heat sink of FIG. 4a further illustrating the fan;

FIG. 4d is a cross sectional view of a heat sink having a heater, a fan, and a pedestal, the pedestal having a recess;

FIG. 4e is a bottom view of the heat sink of FIG. 4d further illustrating the heater, pedestal, and recess;

FIG. 4f is a top view of the heat sink of FIG. 4d further illustrating the fan;

FIG. 5b is a cross sectional view of the socket of FIG. 5a in an open position enabling placement and removal of the electronic component;

FIG. 6 is a top view of the socket of FIG. 5a;

FIG. 7 is a top view of a burn-in board of the present invention populated by sockets of FIG. 5a.

DETAILED DESCRIPTION OF THE INVENTION

A convection burn-in oven has a plurality of burn-in boards, each board having a plurality of sockets for electrically contacting many electronic components at one time. To overcome variation in temperature produced, for example, as a result of differences in dissipation by each of the modules in the oven, each socket is equipped with a socket cover including a heat sink and a sensor. The heat sink and sensor are spring loaded so they make direct, temporary contact to an electronic component in the socket during burn-in. A heat transferring device is coupled to each heat sink. A temperature controller uses input from the sensor to provide heat or cooling from the heat transferring device to each heat sink to individually control the temperature each component.

The heat transferring device is either a heater or a cooling device. The heater is most simply an electric heater, but it can also be a radiant laser heater. The cooling device is most simply a fan. The heater or cooler can also be a thermoelectric device. It can also be a fluid impingement device for directing a cooling flow of gas or liquid at the heat sink. Thus, while the convection oven provides controlled temperature air flow to heat or cool all the components in the chamber, each heat transferring device individually tailors the heat flow to or from each component to provide that all of the components are operating at the same temperature. Thus, wide variation in temperature among the components in the convection oven as a result, for example, of their widely varying dissipation, is overcome, and all components are individually controlled to operate during burn-in at a uniform temperature.

Figure 1A:
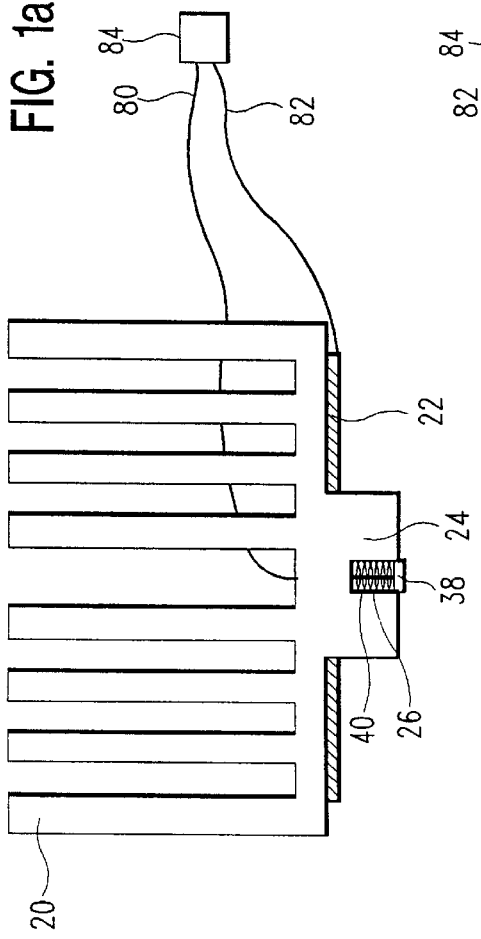
FIG. 1a is a cross sectional view of a heat sink having a heater, and a pedestal having a recess, the recess having a sensor.
Figure 1B:
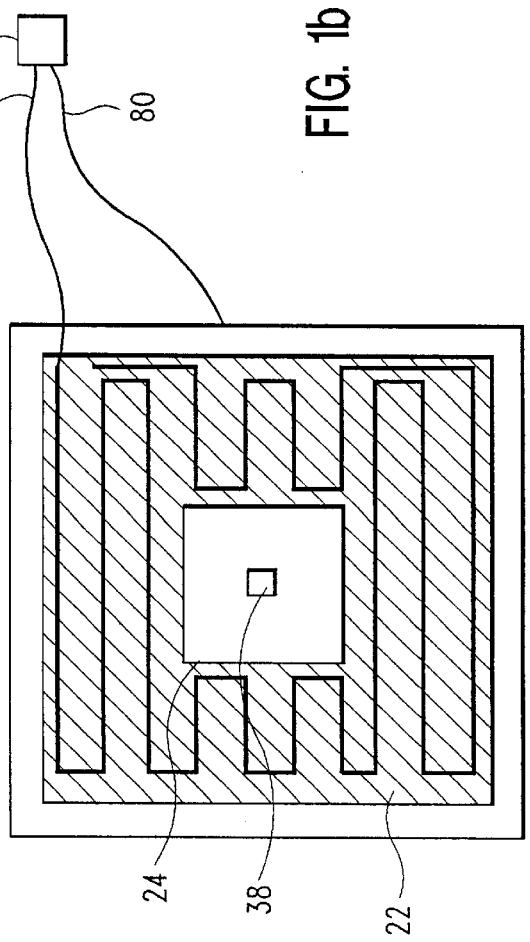
FIG. 1b is a bottom view of the heat sink of FIG. 1a further illustrating how the heater contacts the heat sink while the pedestal and the sensor in the recess are both separately available to contact a component.
Figure 1C:
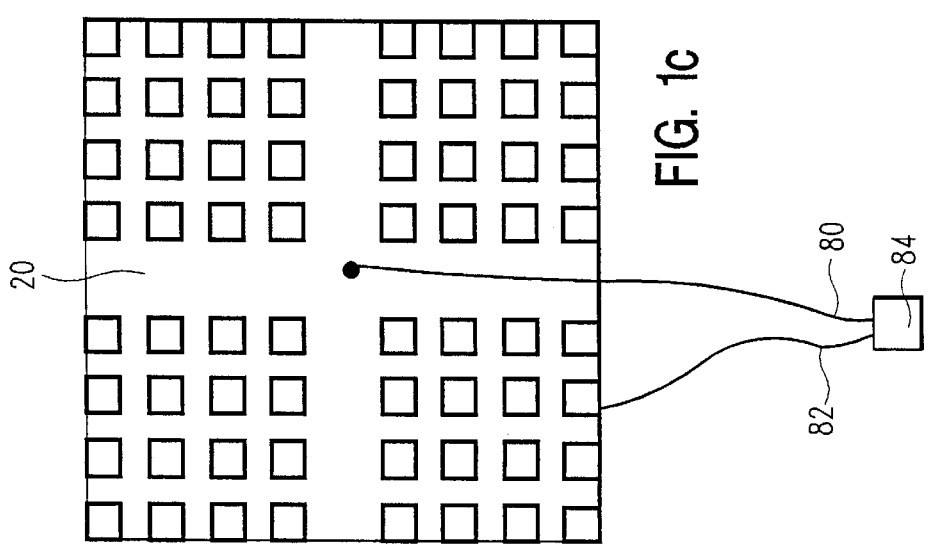
FIG. 1c is a top view of the heat sink of FIG. 1a further illustrating how wiring contacts the heater and the sensor.
Figure 2A:
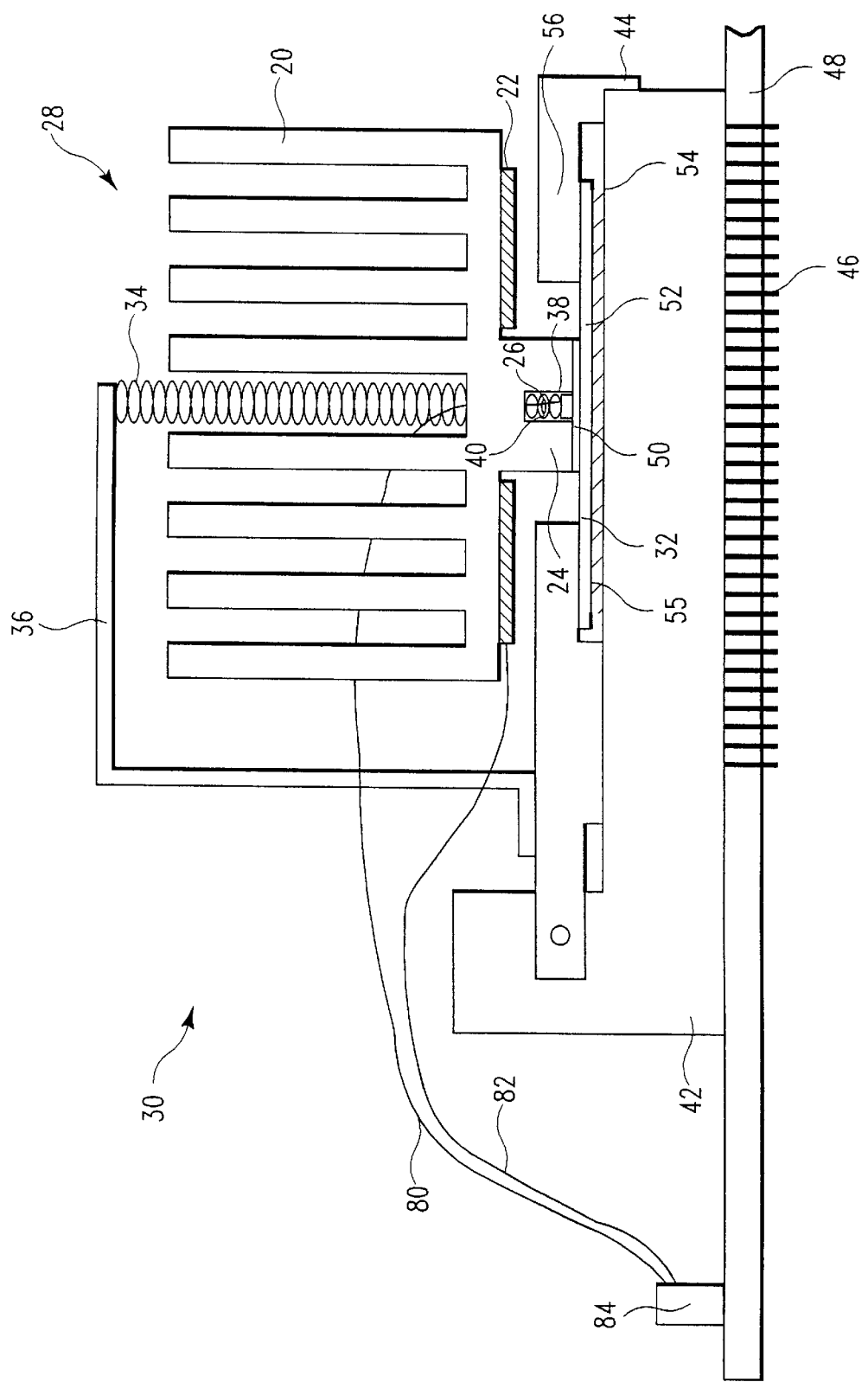
FIG. 2a is a cross sectional view of a burn-in board having an electronic component mounted in a socket having a socket cover including the heat sink shown in FIGS. 1a–1c, the socket cover in a closed position.
Figure 2B:
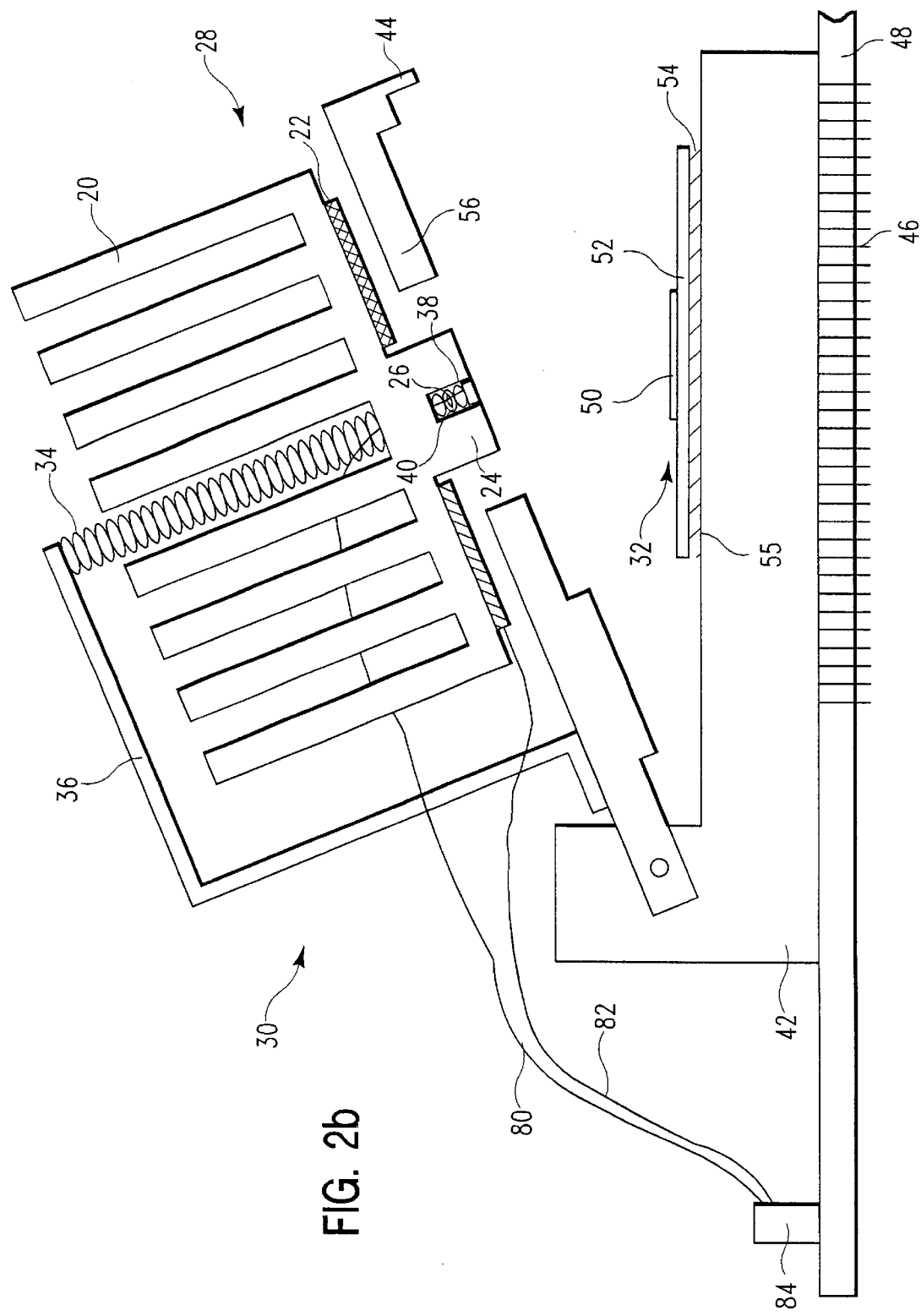
FIG. 2b is a cross sectional view of the socket of FIG. 2a in an open position enabling placement and removal of the electronic component.

Heat sink 20 having thin film heater 22 and pedestal 24 having recess 26 is shown in cross sectional view in FIG. 1a, in bottom view in FIG. 1b, and in top view FIG. 1c. Heat sink 20 is made of a thermally conductive material, such as aluminum or copper. Thin film heater 22 is bonded to heat sink 20 with a thin layer of a thermally conductive adhesive. Heat sink 20 is mounted in cover 28 of socket 30, as shown in FIG. 2a. Pedestal 24 is pressed in temporary physical contact with electronic component 32 by spring 34 pressing against cover arm 36 with a force in the range from about 5 to about 10 pounds. This force is kept low to avoid damage to component 32. Electronic component 32 is typically an integrated circuit (IC) chip. It could also be a packaged IC chip. Sensor 38 mounted in recess 26 is separately pressed in temporary physical contact with electronic component 32 by spring 40 pressing against heat sink 20 in recess 26 with a force in the range from about 0.1 to 1 pound. Socket cover 28 latches against socket base 42 with latch 44. Socket base 42 includes pins 46 soldered into burn-in board 48. Socket 30 in open position is shown in FIG. 2b. It is seen that heat sink 20 and sensor 38 make physical contact with component 32 only when socket cover 28 is closed.

Electronic component 32 includes semiconductor integrated circuit chip 50 mounted on substrate 52 having contacts pins 54. Limiting the force is important if chip 50 is mounted with C4 connectors. Substrate 52 is commonly formed of a material such as ceramic, semiconductor, organic, or a metal lead frame. Socket cover 28 includes pressure plate 56 that pushes down on substrate 52 when cover 28 is latched to socket base 42. The force provided by plate 56 must be sufficient to push contacts 54 into good electrical contact with contactors 55 in socket base 42 so that good electrical contact is maintained there between during elevated temperature burn-in, and typically a force in the range from about 30 to 100 pounds is needed. Thus, cover 28 of socket 30 includes provision of three independent forces: (a) pressure plate 56 to substrate 52 to provide electrical contact between IC chip 50 and socket 30; (b) heat sink 20 to IC chip 50 to provide a thermal path for heat flow between IC chip 50 and heat sink 20; and (c) sensor 38 to IC chip 50 to provide an accurate measurement of component temperature. Providing pressures on IC chip 50 independently of pressure on substrate 52 reduces the chance of damage to IC chip 50 and to its connectors, providing substantial advantage.

FIGS. 1a–1c and 2a–2b are schematic illustrations showing an arrangement of the components. One preferred embodiment of the present invention is an improvement of a clamshell socket assembly described in copending U.S. patent application Ser. No. 09/078,769 having incorporated herein by reference. That application provides a socket cover that pushes a component substrate into contacts in a socket and holds a passive heat sink for contact with a chip on the substrate, wherein forces on the substrate and on the chip are independently provided. That application provides details of the socket assembly including cover 28, heat sink 20, and the independent forces provided to integrated circuit chip 50 and substrate 52. The passive heat sink of that application can be removed and replaced with the assembly shown in FIGS. 1d and 1e.

The invention can be adapted to others kinds of sockets or contactor assemblies. For example, cover arm 36 and spring 34 can be replaced with a flat bar of appropriate dimensions to provide the spring force. The invention can be adapted to a wide range of available sockets including sockets that do not have pivoting covers. The invention can be attached using other mechanical fasteners, such as latches or clamps. Also, heat sink 20 does not have to be connected to pressure plate 56; heat sink 20 can be separately attached to burn-in board 48 or socket base 42.

Figure 1D:
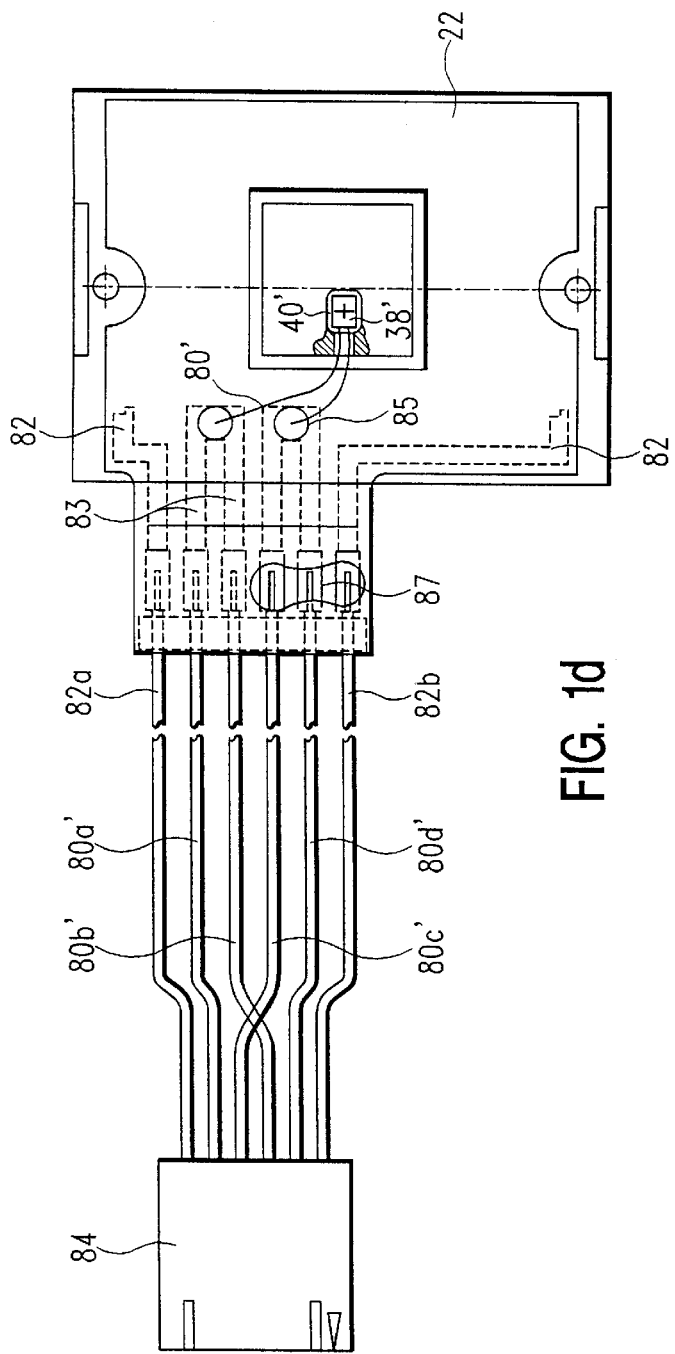
FIG. 1d is a bottom view of a preferred embodiment an assembly including the heat sink of FIG. 1a, the heater, the temperature sensor, the wiring, and a connector.
Figure 1E:
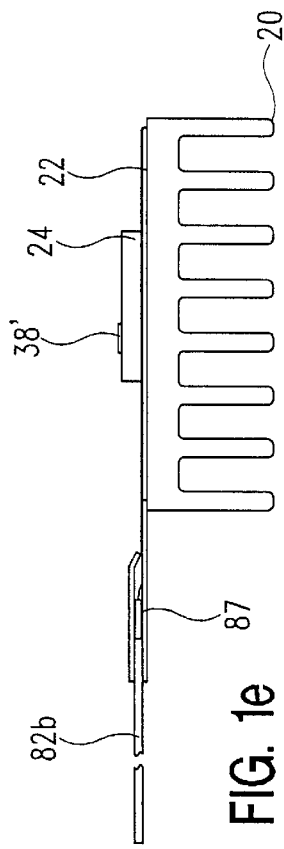
FIG. 1e is a side view of the assembly of FIG. 1d.
Figure 1F:
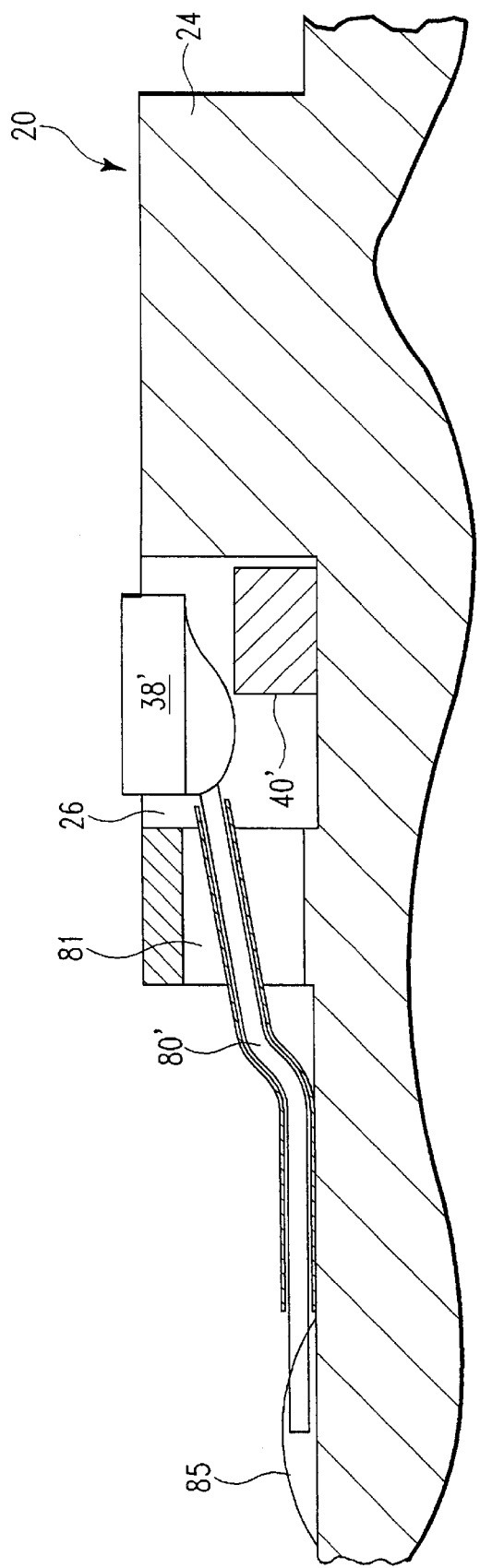
FIG. 1f is a enlarged cross sectional view of the portion of FIG. 1e showing the temperature sensor, its wiring and its mounting, including a foam pad spring.

A preferred embodiment of sensor 38 and its mounting is illustrated in FIGS. 1d–1f. Sensor 38 in recess 26 is 100 ohm ceramic resistive temperature device (RTD) 38' connected by Teflon-insulated wires 80' extending through hole 81 on the side of pedestal 24 in heat sink 20. Silicone foam pad 40' has been found to provide the spring force needed to force RTD 38' against electronic component 32 while taking up less space than a coil spring. Also foam pad 40' conforms to sensor 38', helps insulate it from heat sink 20, and provides uniform pressure on sensor 38'. Other kinds of springs and temperature sensors can also be used. For example, temperature sensors such as thermocouples, thermistors, or analog temperature sensors can also be used, and are well known in the art.

Each wire 80' from RTD38' is soldered to two traces 83 on thin film heater 22 at solder joint 85, as shown in FIG. 1d and in enlarged cross sectional view in FIG. 1f. Each of the four traces 83 for RTD 38' is in turn soldered to wire 80a'–80d' at solderjoint 87, as shown in FIGS. 1d, 1e. A high temperature solder, such as tin-silver is used for solder joint 85 and solder joint 87. Wires 80a'–80d' are also connected to connector 84 from which connection is made to burn-in board 48 (FIG. 2a). The use of four wires 80a'–80d' ensures that the voltage measurement across RTD 38' is not affected by IR drops associated with current through wiring 80a'–80d' and connector 84. Also two heater traces 82 on thin film heater 22 are soldered to wires 82a, 82b that are also connected through connector 84 on burn-in board 48. Alternatively, heater 22, traces 82, 83, wires 80a'–80d', and wires 82a, 82b can all be formed in flex circuitry. Six individual wires 80a'–80d' and 82a, 82b are preferred since they exert less mechanical force on heat sink 20 than would a flex circuit.

Providing wires 80' extending through hole 81 through the side of pedestal 24 (FIG. 1f) allows vertical movement of the temperature sensor and permits aligning temperature sensor 38' in the center of recess 26 so that it is thermally isolated from heat sink 20 and is free to move. A recess in surface 24' of pedestal 24 could also be used but hole 81 is preferable since it limits movement of RTD 38' and avoids the need for excessive machining of surface 24'.

Pedestal 24 can have length and width dimensions equal or larger than chip 50 to provide the largest area of thermal contact with chip 50 and to provide a surface applicable to chips of any size, as shown in FIG. 2a. Alternatively, pedestal 24 is made with dimensions slightly smaller than chip 50 to avoid damaging edges of chip 50 when pedestal 24 is pressed into contact with the chip.

Figure 3A:
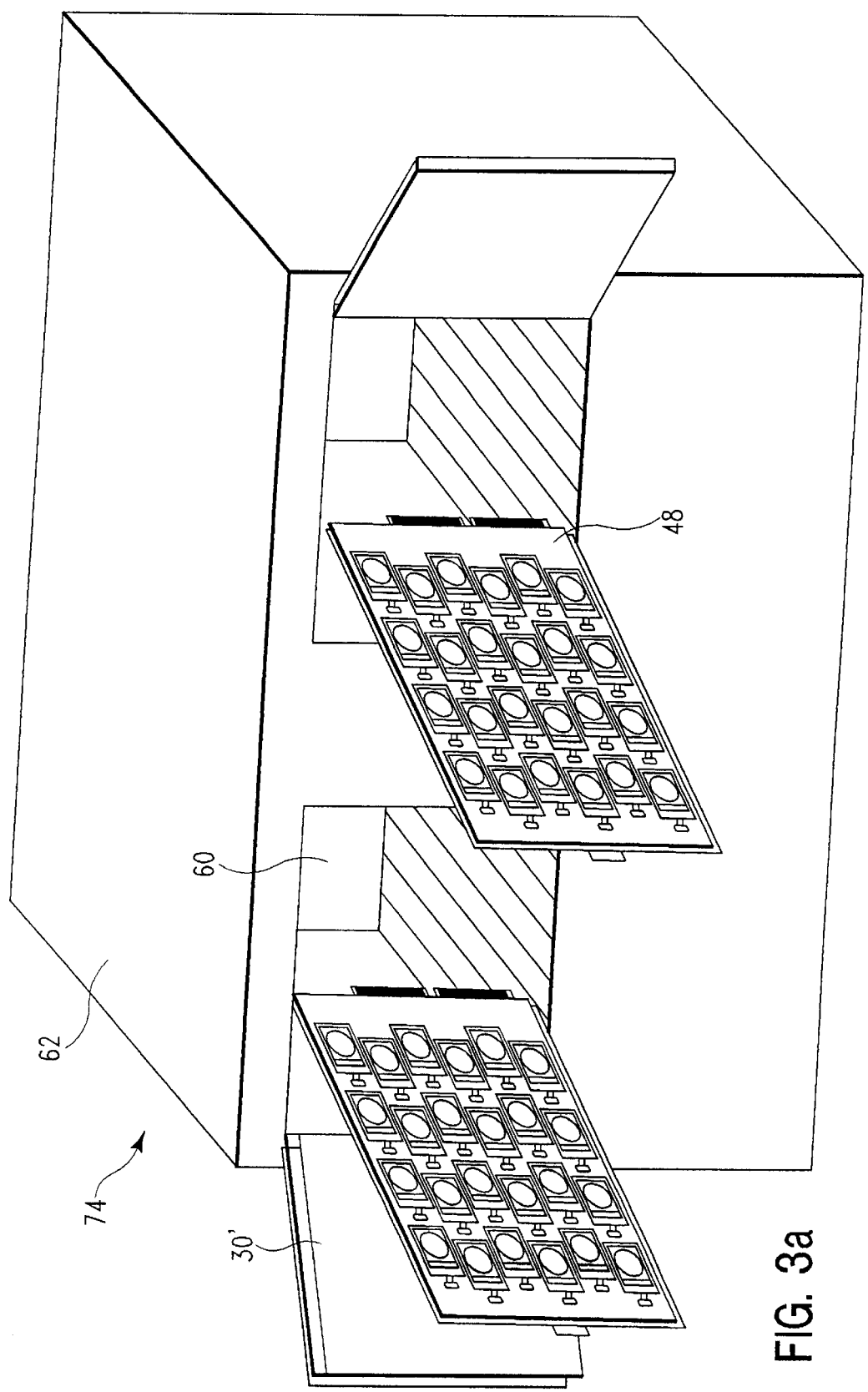
FIG. 3a is a three dimensional view of a burn-in system showing burn-in boards having sockets of the present invention being loaded.
Figure 3B:
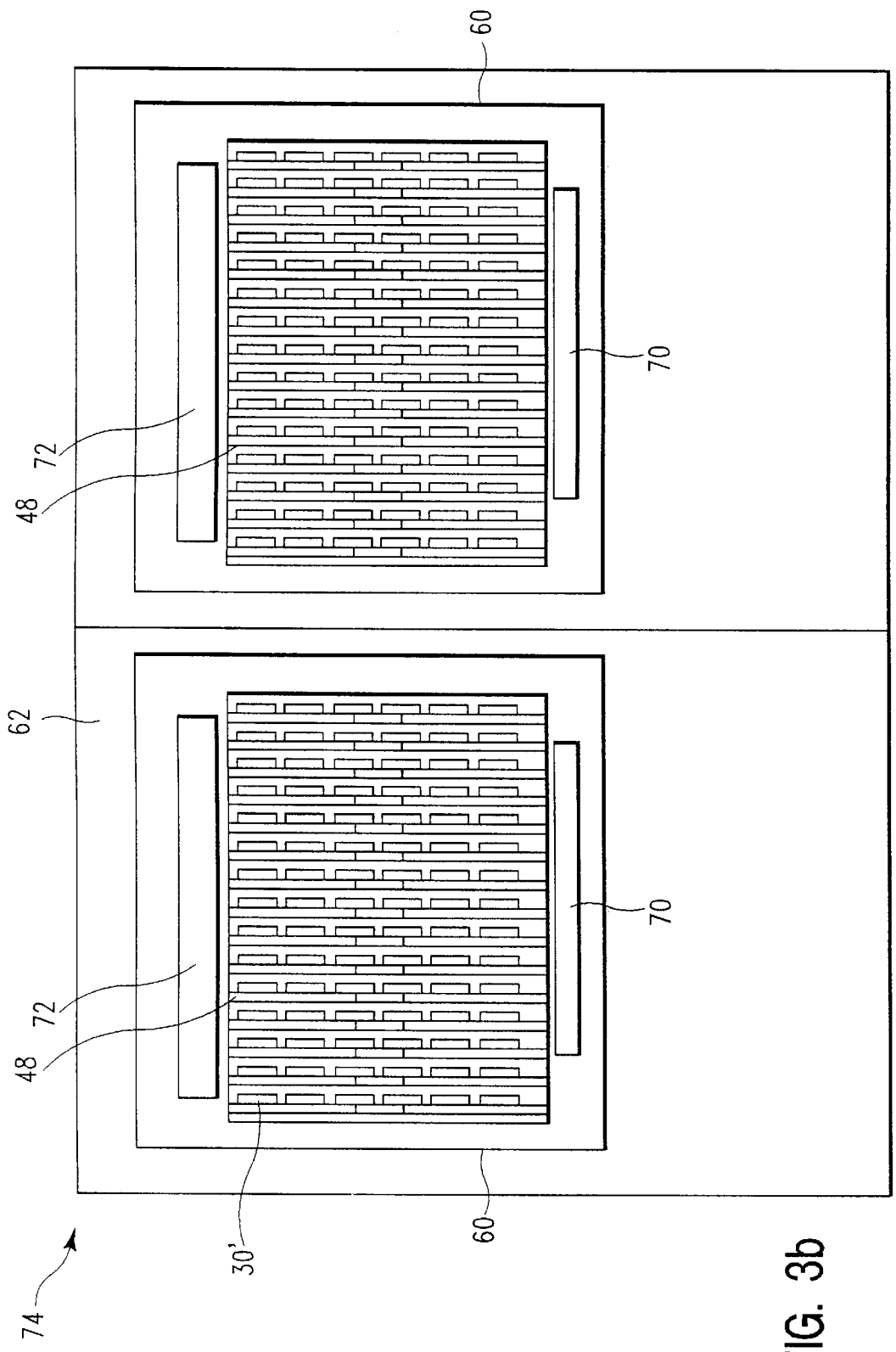
FIG. 3b is a front view of the burn-in system of FIG. 3a showing the chamber fully populated with burn-in boards.
Figure 5A:
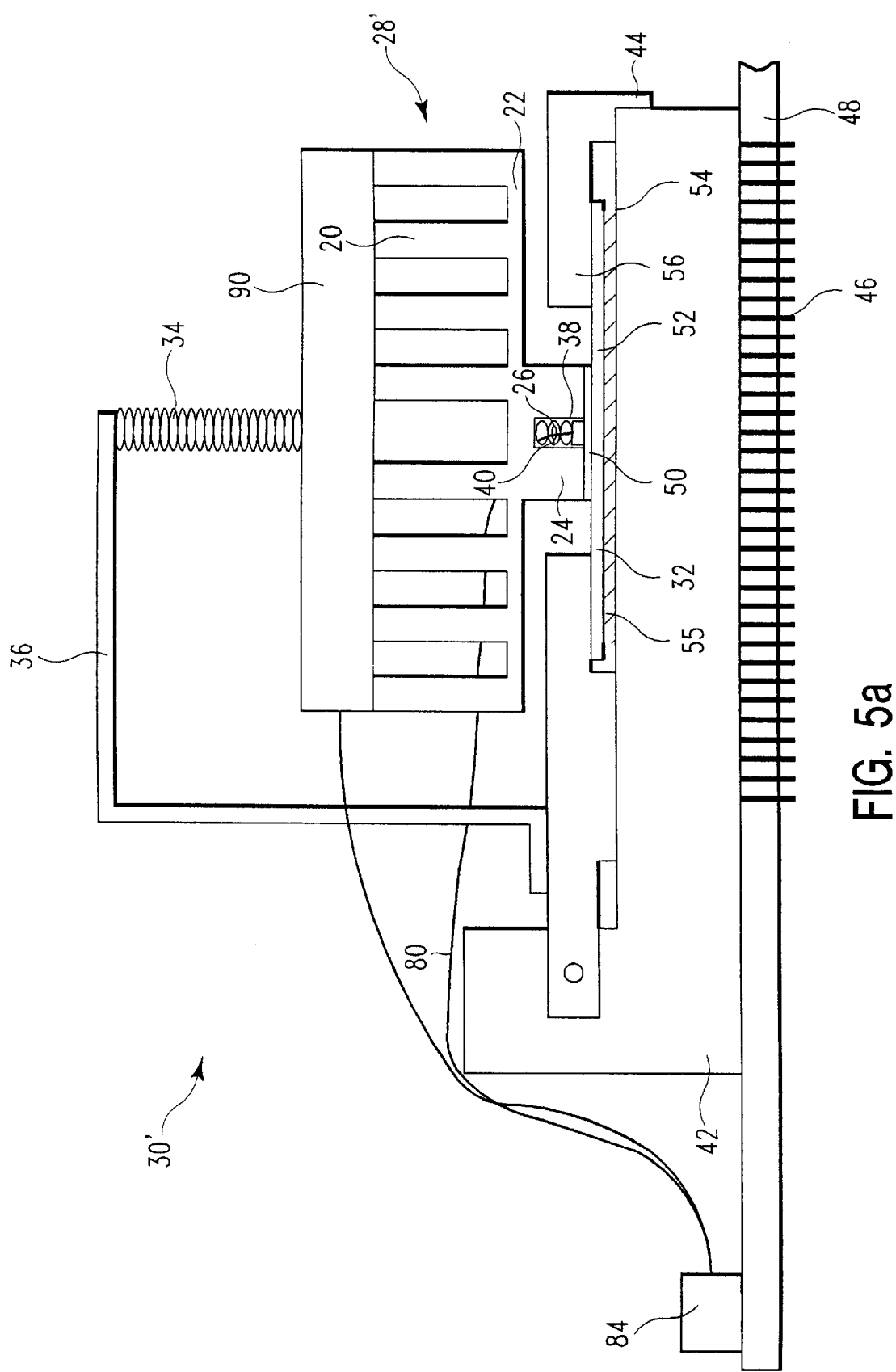
FIG. 5a is a cross sectional view of a burn-in board having an electronic component mounted in a socket of the invention shown in FIGS. 4a–4c, the socket in a closed position.

Burn-in board 48 is a printed circuit board on which are mounted many sockets 30, as shown in FIGS. 3a and 3b. In conducting efficient burn-in with high productivity, many burn-in boards 48 are plugged into burn-in chamber 60, which is preferably a convection oven. Forced air convection chamber 60 includes enclosure 62 and preferably includes both heating and cooling mechanisms and controls to maintain a set temperature within, as shown in FIGS. 3a and 3b. Chamber heating is accomplished with electric heaters 70, or by other well known heating devices. Cooling is accomplished with a water to air heat exchanger, mechanical refrigeration, or passively, by providing reduced chamber wall insulation to enable heat to leak out. In addition to air, the fluid within chamber 60 can be helium, nitrogen, or a liquid, such as floronert, a dielectric liquid that conducts heat but does not conduct electricity. When loaded with burn-in boards 48, chamber cooling fan 72 provides a high velocity of cooling airflow between burn-in boards 48, removing large amounts of heat from each component by forced convection.

Figure 7:
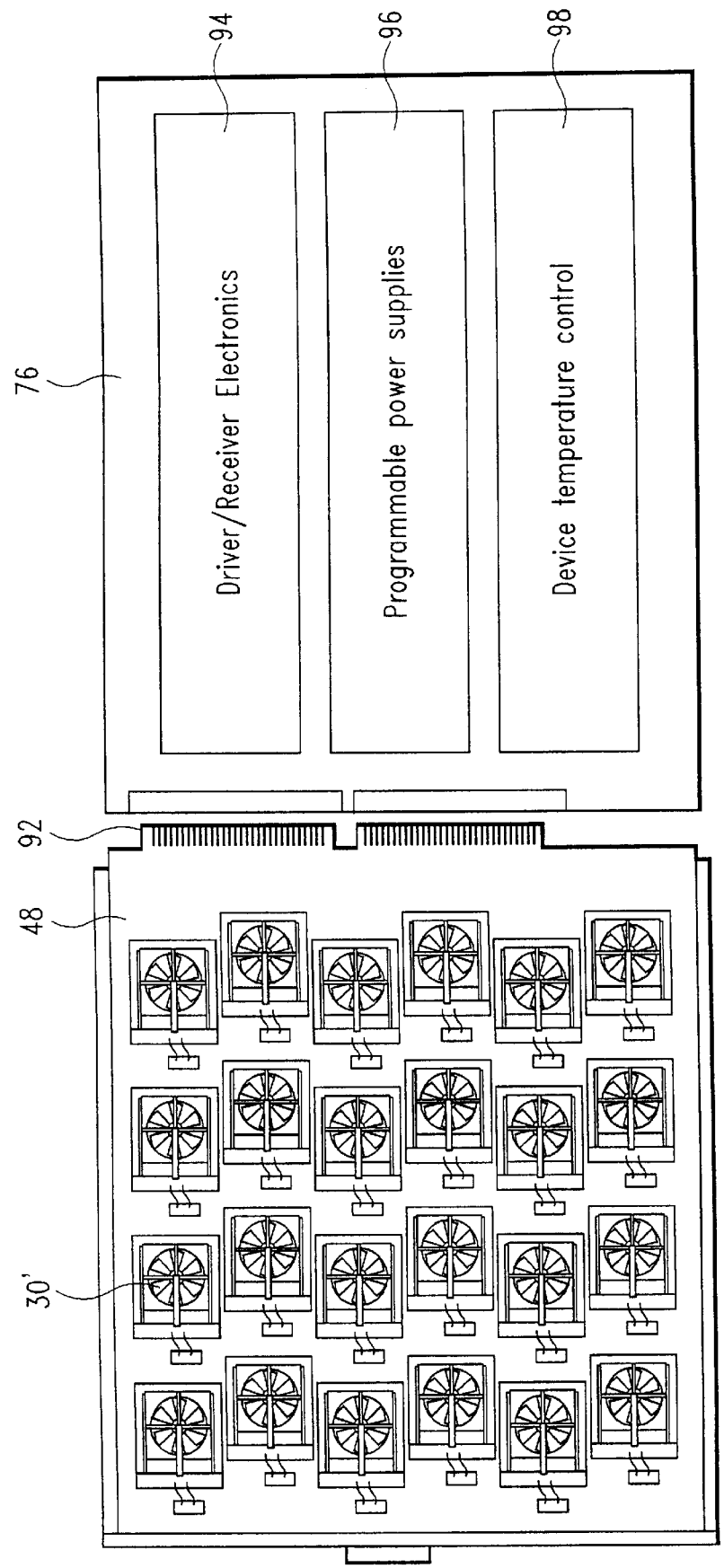

Burn-in system 74 also includes driver boards 76 that provide power and stimulation patterns to electronic components 32 and individual device temperature controller signals to heater 22. Oven electronics and driver boards 76 are located outside chamber 60 (see FIG. 7) where they can function at a temperature substantially lower than the 140C typically used to burn-in electronic components 32. Burn-in system 74 can be divided into several zones, each controlled by a separate control board 76. Heater 22 and sensor 38 are connected to a controller on driver board 76 through sensor wire 80 and heater wire 82, board connector 84, and standard board wiring (not shown).

Figure 6:
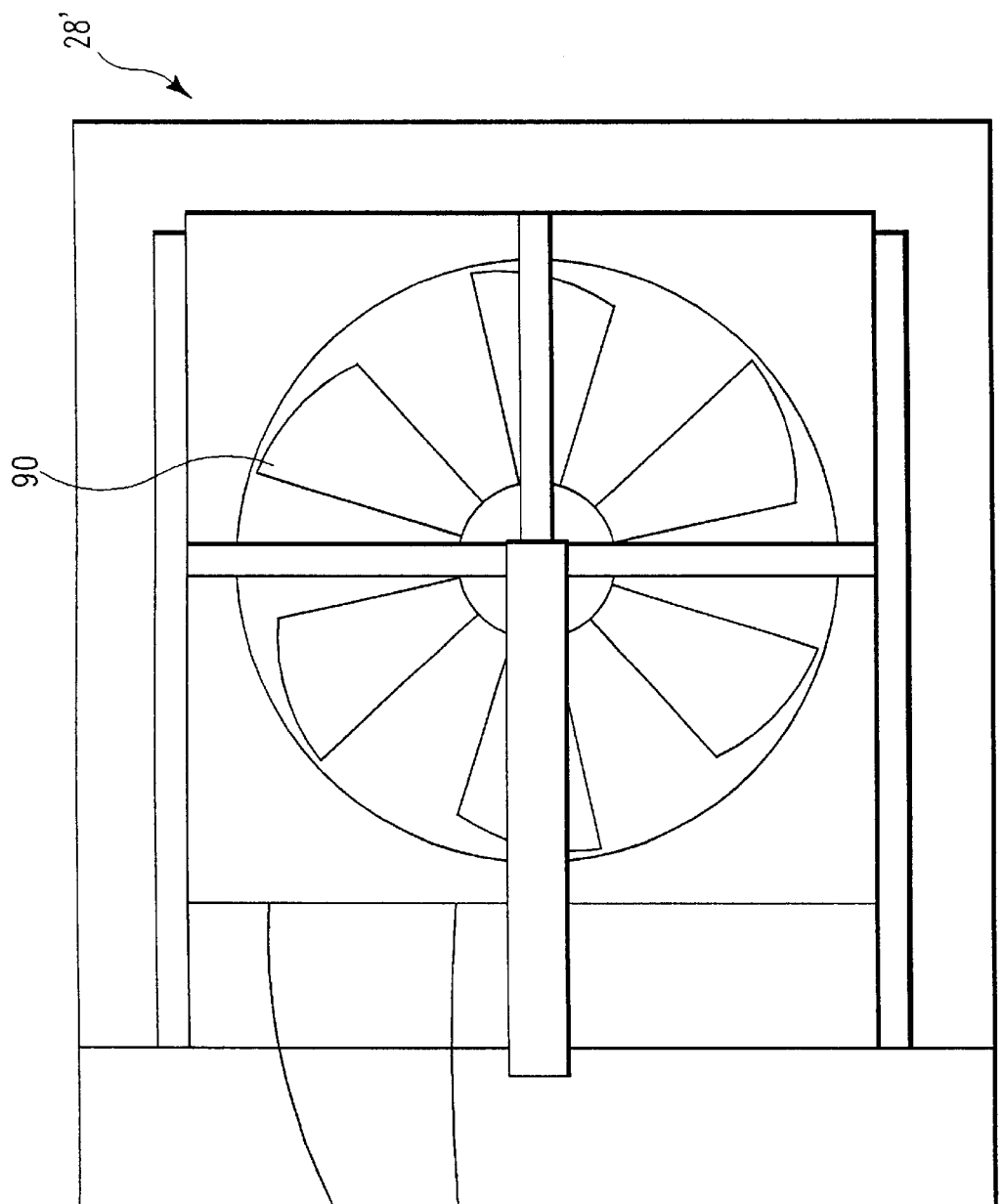

Heater 22 can be replaced with heat sink fan 90 as shown in FIGS. 4a–4c and 5a–5b. A top view of socket 30' having fan-cooling in cover 28' is provided in FIG. 6. An array of sockets 30' is mounted on pluggable burn-in board 48 in FIG. 7. Burn-in board 48 is plugged into control board 76 with end connector 92. Control board 76 includes driver/receiver electronics 94, programmable power supplies 96, and device temperature controllers 98 that receive temperature signals from sensors 38 and provide on/off signals to heater 22 or fan 90. Alternatively, controllers 98 can provide a varying voltage or frequency to heater 22 or fan 20.

Of course, heater 22 and fan 90 can both be coupled to heat sink 20, as shown in FIGS. 4d–4f. While providing heater 22 connected to the bottom surface of heat sink 20 and fan 90 mounted to direct air at the top surface of heat sink 20 is more expensive than providing a single heat transferring device, such a structure would provide improved control over the temperature of individual components 32, allow wider variation in power dissipation among components 32, and provide means to make up for wider variation in oven temperature. For example, a very high dissipating component may not be suffficiently cooled simply by leaving heater 22 off. In this case, fan 90 turns on to cool the component. In the same chamber run a very low dissipating component may need heater 22 on nearly full time, reducing the option of lowering chamber temperature with chamber heater and cooling controls.

Figure 8A:
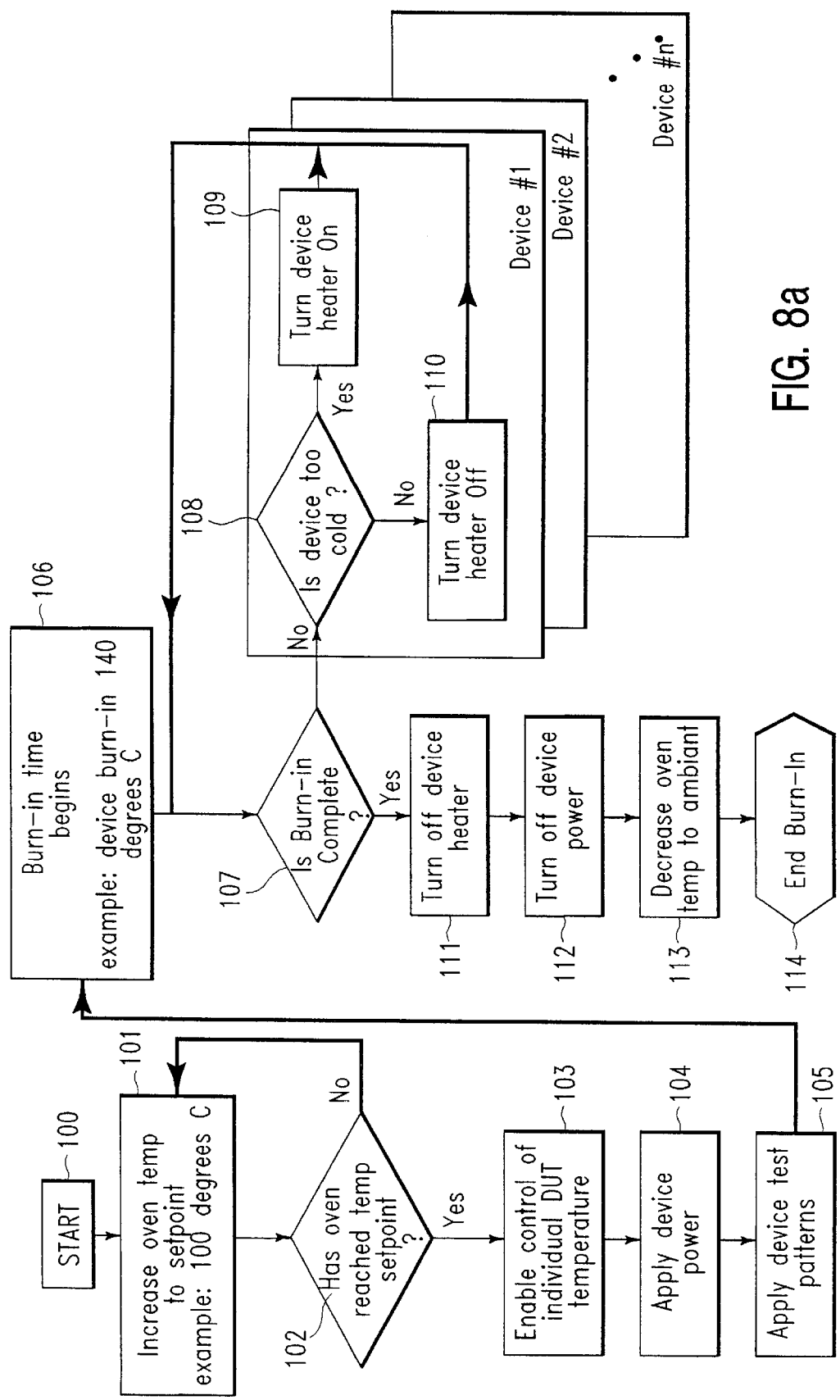
FIGS. 8a and 8b are flow charts showing the steps to burn-in electronic components using the sockets of the present invention.
Figure 8B:
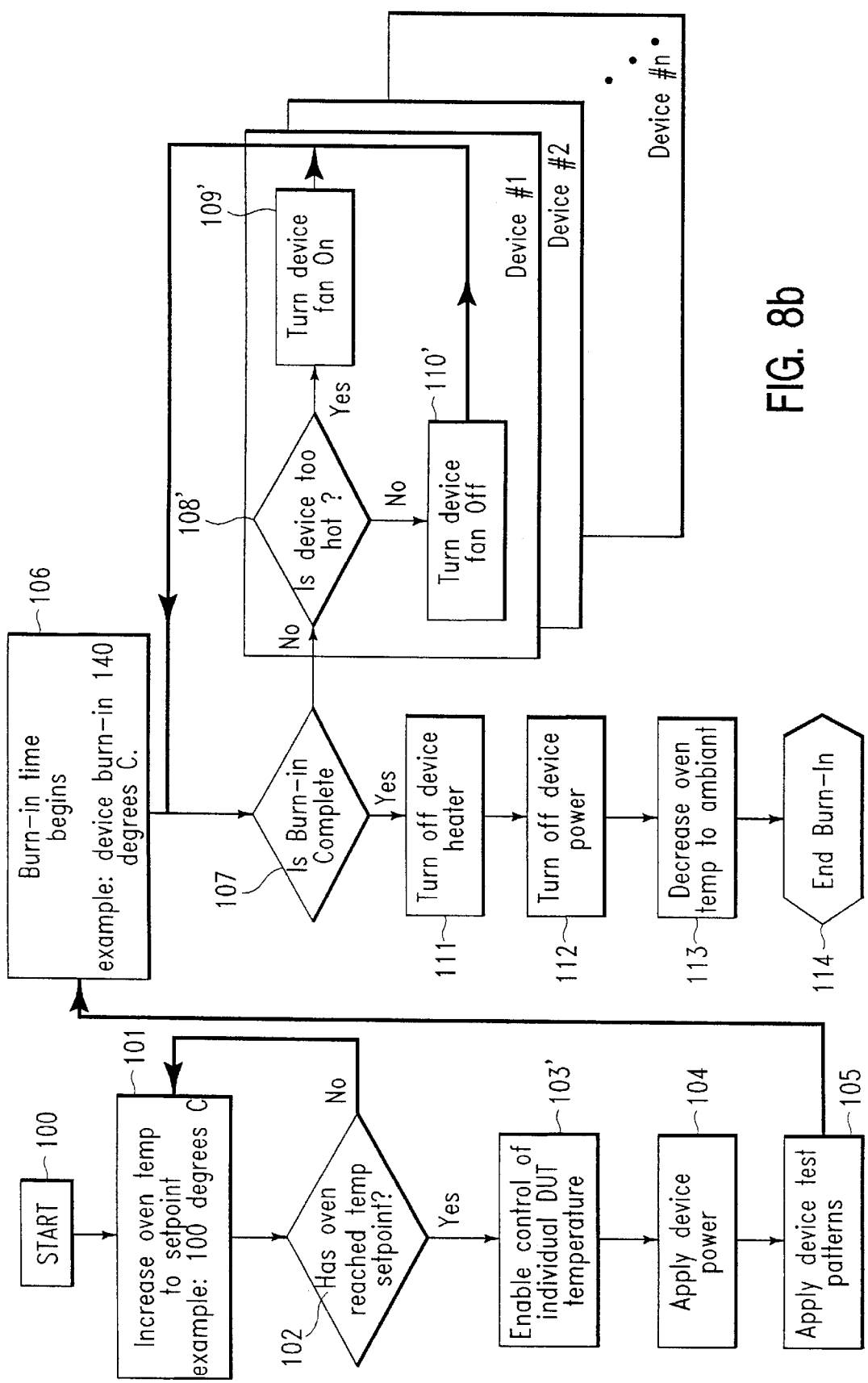

In preparation for performing burn-in, components 32 are first loaded on burn-in boards 48 and plugged into burn-in chamber 60. The next series of steps for performing the burn-in operation on a large number of components in chamber 60 are shown in the flow charts of FIGS. 8a and 8b. FIG. 8a illustrates the steps for a burn-in system having individual heaters to add heat to each individual electronic component while FIG. 8b illustrates the nearly identical steps for a burn-in system having individual fans to remove heat from each individual electronic component. The burn-in system is turned on as shown in step 100. Next, chamber-heaters are used to increase chamber temperature to a set point below the burn-in temperature, such as 100° C., as shown in steps 101 and 102. Once chamber set point temperature has been achieved, control of individual component heaters (step 103, FIG. 8a) or coolers (step 103', FIG.

8b) is enabled. Next, device power and patterns are applied, as shown in steps 104 and 105. As a result of heat provided in the chamber by the chamber heaters, heat generated by the components in operation, and heat provided by individual component heaters or removed by individual component coolers, components are brought to the specified burn-in temperature, typically about 140° C. over a period of time, typically about two minutes. After this delay burn-in timing Device heater 22 is turned on or off in response to repeated queries about the temperature provided by sensor 38. In a similar manner, if the component is too hot, a temperature controller on control board 76 (FIG. 7) provides a signal to turn individual fan 90 on or off as shown in steps 108', 109', and 110' of FIG. 8b. Once burn-in is complete, individual device heaters, device power and device patterns are turned off, chamber heaters are turned off, chamber cooling is implemented to decrease chamber temperature to room temperature, and the burn-in system is turned off, as shown in steps 111, 112, 113, and 114.

Preferably chamber-heater 70 provides chamber 60 at a temperature so that all components need at least a small amount of heat from their individual chip heaters 22. An over temperature alarm or an automatic control is provided if components 32 are running too hot. In this case, chamber heater 70 is adjusted to provide a sufficiently low temperature in the chamber so no component is running too hot. Similarly, in the case where individual chip coolers 90 are used, chamber temperature is set so that no component is running too cool and so all components need at least some cooling with their individual fans 90.

The exact chamber ambient temperature required will depend on factors such as the type of temperature controller, component power dissipation, type of socket and the variations in component power, airflow velocity, and air temperature in the chamber. The chamber set point temperature can be determined experimentally for a certain class of products or can be adjusted in real time during the burn-in run based on feedback from the chip temperature sensors. In this way, each component is individually controlled and differences in temperature as a result of differences in dissipation are avoided while active chamber heating and cooling improve throughput, reduce demand on individual heaters or fans, and lower cost.

The present inventors have designed and built a socket having a heat sink that has the same vertical dimension as a standard socket without a heat sink. The socket also has a thermocouple temperature sensor and a forcing plate, each providing a separate force, as described herein above. With these sockets mounted on burn-in boards, substantial additional temperature control over individual components is achieved without lowering the number of components that can fit in the chamber for burn-in. For high dissipation components a larger heat sink can be used, and to the extent a taller heat sink is needed, oven loading is reduced.

While several embodiments of the invention, together with modifications thereof, have been described in detail herein and illustrated in the accompanying drawings, it will be evident that various further modifications are possible without departing from the scope of the invention. For example, alternate methods of cooling can be used, such as blowing cold air or liquid individually on each part. Nothing in the above specification is intended to limit the invention more narrowly than the appended claims. The examples given are intended only to be illustrative rather than exclusive.

What is claimed is:

1. An apparatus for burning-in a plurality of electronic components dissipating high power, comprising:

a chamber having a chamber temperature controller; and
a plurality of assemblies for burning-in components in said chamber, each assembly comprising:
a socket for temporarily holding one of the components during burn-in;
a heat sink for pressing in temporary direct physical contact with the component in said socket;
a temperature sensor for sensing temperature of the component in said socket; and
a heat transferring device positioned to transfer heat to or from said heat sink;
wherein said heat sink further comprises a first separate mechanical forcer for forcing said temperature sensor into contact with said component.

2. The apparatus of claim 1, wherein said chamber is a convection oven.

3. The apparatus of claim 2, wherein said convection oven provides an air flow directed at all components.

4. The apparatus of claim 1, wherein said chamber temperature controller comprises a chamber heater.

5. The apparatus of claim 1, wherein said chamber temperature controller comprises a chamber cooler.

6. The apparatus of claim 1, wherein said chamber temperature controller comprises both a chamber heater and a chamber cooler.

7. The apparatus of claim 1, wherein said plurality of assemblies are mounted on burn-in boards and a plurality of said burn-in boards are mounted in said chamber.

8. The apparatus of claim 1, wherein said sensor is one of a thermocouple, an RTD, and a thermistor.

9. The apparatus of claim 1, wherein said sensor is thermally isolated from said heat sink.

10. The apparatus of claim 1, wherein said sensor is mounted for pressing in temporary direct contact with the component.

11. The apparatus of claim 1, wherein said heat transferring device is for adjusting temperature of the component through said heat sink, wherein said heat transferring device is controlled by said temperature sensed by said temperature sensor.

12. The apparatus of claim 1, wherein each heat transferring device of said plurality of assemblies is controlled so said plurality of sensors all provide measured temperatures that are about the same for all the components.

13. The apparatus of claim 1, wherein said heat transferring device comprises a heater.

14. The apparatus of claim 13, wherein said heater is an electric heater in contact with said heat sink.

15. The apparatus of claim 13, further comprising a second heat transferring device positioned to transfer heat to or from said heat sink.

16. The apparatus of claim 15, wherein second heat transferring device comprises a cooling device.

17. The apparatus of claim 16, wherein said heater is an electric heater in contact with said beat sink and wherein said cooling device comprises a fan.

18. The apparatus of claim 1, wherein said heat transferring device comprises a cooling device.

19. The apparatus of claim 18, wherein said cooling device comprises a fan.

20. The apparatus of claim 19, wherein said fan impinges air directed primarily on only one said heat sink.

21. The apparatus of claim 20, wherein said fan is mounted to said heat sink.

22. The apparatus of claim 20, wherein said socket comprises a socket cover and wherein said fan is mounted to said socket cover.

23. The apparatus of claim 1, wherein said heat sink is a finned air cooled heat sink.

24. The apparatus of claim 1, wherein said heat sink has a pedestal, said pedestal for contacting the component.

25. The apparatus of claim 24, wherein said pedestal comprises a recess, said sensor being in said recess.

26. The apparatus of claim 25, wherein wires for said sensor extend through a hole from said recess to a side of said pedestal.

27. The apparatus of claim 24, wherein said pedestal extends from a base of said heat sink, said heater thermally contacting said base.

28. The apparatus of claim 1, wherein said first separate mechanical forcer for forcing said sensor into contact with said component comprises a spring.

29. The apparatus of claim 1, wherein said fist separate mechanical forcer for forcing said sensor into contact with said component comprises a foam pad.

30. The apparatus of claim 1, wherein said assembly comprises a cover, wherein said cover comprises said heat sink.

31. The apparatus of claim 30, wherein each said sensor is mounted on said heat sink.

32. The apparatus of claim 30, wherein said heat transfer device is mounted on said heat sink.

33. The apparatus of claim 30, wherein said cover further comprises a second separate mechanical forcer for forcing said heat sink into contact with said component.

34. The apparatus of claim 33, wherein said second separate mechanical forcer for forcing said heat sink into contact with said component comprises a spring.

35. The apparatus of claim 30, wherein said socket further comprises electrical contactors, said cover further comprising a separate mechanical forcer for forcing said component into electrical contact with said contactors.

36. A method of burning-in a plurality of electronic components dissipating high power, the method comprising the steps of:

a) providing a chamber having a chamber temperature controller;

b) providing a plurality of assemblies for burning-in components in said chamber, each assembly comprising:

a socket for temporarily holding the component during burn-in;

a heat sink for pressing in temporary direct physical contact with the component in said socket;

a temperature sensor for sensing temperature of the component in said socket;

a heat transferring device positioned to transfer heat to or from said heat sink;

wherein said heat sink further comprises a separate mechanical forcer for forcing said temperature sensor into contact with said component;

c) enabling said chamber temperature controller to provide a specified chamber temperature;

d) enabling said heat transferring devices to transfer heat to or from said components through said heat sink; and e) burning in said components.

37. The method of claim 36, further comprising a component temperature controller connected to said temperature sensor and to said heat transferring device, wherein in said enabling step (d) said heat transferring device is controlled by said temperature controller in response to a temperature sensed by said temperature sensor.

38. The method of claim 36, wherein said chamber is adjusted to a temperature to provide a high dissipation component at close to a desired temperature wherein heat transferring devices are used to bring lower dissipation components to said temperature.

39. The method of claim 36, wherein said chamber is adjusted to a temperature to provide a low dissipation component at close to a desired temperature wherein heat transferring devices are used to bring higher dissipation components to said temperature.

40. The method of claim 38, wherein said heat transferring devices are heater devices.

41. The method of claim 40, wherein said heater devices are electric heaters.

42. The method of claim 39, wherein said heat transferring devices are cooling devices.

43. The method of claim 42, wherein said cooling devices are fans.

\* \* \* \* \*